United States Patent
Ichihashi et al.

(10) Patent No.: US 11,271,476 B2
(45) Date of Patent: Mar. 8, 2022

(54) POWER SUPPLY CIRCUIT COMPRISING A CHARGE PUMP CIRCUIT AND A FEEDBACK CIRCUIT FOR THE CHARGE PUMP CIRCUIT

(71) Applicant: SONY SEMICONDUCTOR SOLUTIONS CORPORATION, Kanagawa (JP)

(72) Inventors: Masahiro Ichihashi, Fukuoka (JP); Kenya Kondou, Fukuoka (JP); Kazumasa Nishimura, Fukuoka (JP); Syou Mitsuishi, Fukuoka (JP); Toshio Suzuki, Fukuoka (JP); Nobuhiko Shigyo, Fukuoka (JP); Masayuki Katakura, Kanagawa (JP); Motoyasu Yano, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 184 days.

(21) Appl. No.: 16/609,811

(22) PCT Filed: Apr. 24, 2018

(86) PCT No.: PCT/JP2018/016607
§ 371 (c)(1),
(2) Date: Oct. 31, 2019

(87) PCT Pub. No.: WO2018/207614
PCT Pub. Date: Nov. 15, 2018

(65) Prior Publication Data
US 2021/0281169 A1    Sep. 9, 2021

(30) Foreign Application Priority Data
May 9, 2017 (JP) .............................. JP2017-093425

(51) Int. Cl.
H02M 1/08 (2006.01)
H02M 3/07 (2006.01)
H02M 1/14 (2006.01)

(52) U.S. Cl.
CPC ............... *H02M 3/07* (2013.01); *H02M 1/08* (2013.01); *H02M 1/14* (2013.01)

(58) Field of Classification Search
CPC ..... H02M 1/08; H02M 1/14; H02M 3/07–078
See application file for complete search history.

(56) References Cited

U.S. PATENT DOCUMENTS 6,566,847 B1* 5/2003 Chou ........................ G05F 1/46
323/282
2002/0075705 A1* 6/2002 Bayer ................... H02M 1/146
363/59

(Continued)

FOREIGN PATENT DOCUMENTS

CN 1421930 A 6/2003
JP 07-248837 A 9/1995

(Continued)

OTHER PUBLICATIONS

International Search Report and Written Opinion of PCT Application No. PCT/JP2018/016607, dated Jun. 26, 2018, 08 pages of ISRWO.

*Primary Examiner* — Peter M Novak
(74) *Attorney, Agent, or Firm* — Chip Law Group (57) ABSTRACT

A charge pump circuit by which fundamental issues involved in the voltage feedback type charge pump circuit have been solved is realized. A power supply circuit includes a charge pump circuit, a feedback circuit feeding an output of the charge pump circuit back to an input of the charge pump circuit, a first current source causing a constant current to flow through the feedback circuit, a MOS transistor element interposed in a middle of the feedback circuit, a (Continued)

resistor element interposed at a position closer to the output of the charge pump circuit than the MOS transistor element in the feedback circuit, a bias circuit applying a constant voltage to a control terminal of the MOS transistor element, and a control section controlling a value of the constant current which the first current source flows through the feedback circuit.

7 Claims, 5 Drawing Sheets

(56) References Cited

U.S. PATENT DOCUMENTS

| | | | |
|---|---|---|---|
| 2003/0098736 A1 | 5/2003 | Uchikoba et al. | |
| 2008/0013349 A1* | 1/2008 | Yanagida | H02M 3/073 363/60 |
| 2014/0028276 A1 | 1/2014 | Ryu | |
| 2014/0211560 A1 | 7/2014 | Hirata | |
| 2018/0006643 A1* | 1/2018 | Schulmeyer | H03K 5/08 |

FOREIGN PATENT DOCUMENTS

| | | |
|---|---|---|
| JP | 2003-168293 A | 6/2003 |
| JP | 2014-147044 A | 8/2014 |
| JP | 2015-171213 A | 9/2015 |
| KR | 10-2003-0044859 A | 6/2003 |
| KR | 10-2014-0016535 A | 2/2014 |

* cited by examiner

POWER SUPPLY CIRCUIT COMPRISING A CHARGE PUMP CIRCUIT AND A FEEDBACK CIRCUIT FOR THE CHARGE PUMP CIRCUIT

CROSS REFERENCE TO RELATED APPLICATIONS

This application is a U.S. National Phase of International Patent Application No. PCT/JP2018/016607 filed on Apr. 24, 2018, which claims priority benefit of Japanese Patent Application No. JP 2017-093425 filed in the Japan Patent Office on May 9, 2017. Each of the above-referenced applications is hereby incorporated herein by reference in its entirety.

TECHNICAL FIELD

The present technology relates to a power supply circuit.

BACKGROUND ART

In the past, adjusting an output voltage from a charge pump circuit has been performed by voltage feedback using an operational amplifier (e.g., refer to PTL 1 and PTL 2). Specifically, there has been adopted a configuration in which the output voltage of the charge pump circuit is divided by a predetermined ratio in a voltage division circuit. The output voltage of the charge pump circuit is divided by resistance and/or capacitance division. In addition, an output of the operational amplifier is used as an input of the charge pump circuit. Further, the output of the operational amplifier is generated in response to a difference between the divided voltage and a reference voltage.

CITATION LIST

Patent Literature

[PTL 1]
Japanese Patent Laid-Open No. 2014-147044
[PTL 2]
Japanese Patent Laid-Open No. 2015-171213

SUMMARY

Technical Problems

Since in the conventional charge pump circuit described above, a first pole is determined by an external capacitor section, in a case where stability is prioritized, the operational amplifier needs to be designed in a wide band. However, the conventional charge pump circuit has an essential trade-off that, as the operational amplifier is designed in a wider band, noise performance becomes worse. In addition, in the first place, a circuit using the operational amplifier is unsuitable for a low-voltage operation.

Moreover, in a case where a function of adjusting an output voltage is provided in the conventional charge pump circuit described above, a level shifter which changes a voltage division ratio of the voltage division circuit needs to be provided, and thus, an increase in circuit area is unavoidable.

In a case where the operational amplifier is used, since the output of the operational amplifier is inputted to the charge pump circuit (a current (charges) is supplied from the operational amplifier) to drive the charge pump circuit, the operational amplifier having an ability to supply a large current needs to be used. A general A-class operational amplifier is easily designed, whereas the general A-class operational amplifier involves a problem that the power efficiency is very poor. Moreover, the high-efficiency operational amplifier has a problem that a low-voltage operation is difficult, and a degree of design difficulty is high. Therefore, in driving the operational amplifier, elimination of a trade-off between a consumption current and a low-voltage characteristic is very difficult.

The present technology has been made in the light of the problems described above, and it is desirable to realize a charge pump circuit by which fundamental issues involved in a voltage feedback type charge pump circuit have been solved.

Solution to Problems

One of aspects of the present technology is a power supply circuit including a charge pump circuit, a feedback circuit, a first current source, a MOS transistor element, a resistor element, a bias circuit, and a control section. The feedback circuit feeds an output of the charge pump circuit back to an input of the charge pump circuit. The first current source causes a constant current to flow through the feedback circuit. The MOS transistor element is interposed in a middle of the feedback circuit. The resistor element is interposed at a position closer to the output of the charge pump circuit than the MOS transistor element in the feedback circuit. The bias circuit applies a constant voltage to a control terminal of the MOS transistor element. The control section controls a value of the constant current which the first current source flows through the feedback circuit.

It is to be noted that the power supply circuit described so far includes various kinds of aspects in which the power supply circuit is implemented in a state in which the power supply circuit is incorporated in another equipment, the power supply circuit is implemented together with another method, and so forth.

Advantageous Effects of Invention

According to the present technology, the charge pump circuit by which the foundation issues involved in the voltage feedback type charge pump circuit have been solved can be realized. It is to be noted that the effect described in this specification is merely an example and is not limited, and moreover, an additional effect may be provided.

DESCRIPTION OF EMBODIMENTS

Hereinafter, the present technology according to embodiments will be described with reference to the drawings.

(A) First Embodiment

Figure 1:
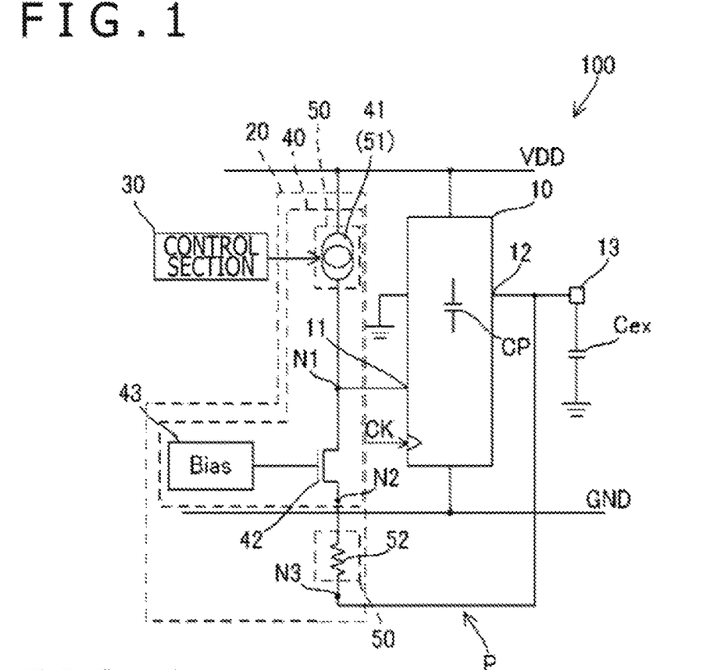
FIG. 1 is a circuit diagram depicting a schematic configuration of a power supply circuit according to a first embodiment.

FIG. 1 is a circuit diagram of assistance in explaining a power supply circuit according to a first embodiment. A power supply circuit 100 according to the first embodiment is a current feedback type charge pump circuit generating an output voltage obtained by dropping an input voltage, and includes a charge pump circuit 10, a feedback circuit 20, and a control section 30.

The feedback circuit 20 forms a feedback path P connecting between an output section 12 of the charge pump circuit 10, and an input section 11 of the charge pump circuit 10.

The feedback path P of the feedback circuit 20 has a first node N1 connected to the input section 11 of the charge pump circuit 10, a third node N3 connected to the output section 12 of the charge pump circuit 10, and a second node N2 provided between the first node N1 and the third node N3.

A charging/discharging voltage to be used in charge/discharge of a capacitor CP which holds charge pump charges, and an oscillation signal for switching control of ON/OFF of a switching element switching a charge/discharge direction for the capacitor CP are supplied to the charge pump circuit 10, and the charge pump circuit 10 outputs a voltage in response to the charging/discharging voltage and the oscillation signal. In the following, the charging/discharging voltage and the oscillation signal which are inputted to the charge pump circuit 10 will be collectively referred to as a CP control signal.

In addition thereto, if necessary, a reference voltage to be used in the charge/discharge of the capacitor CP is suitably supplied from an arbitrary bias source to the charge pump circuit 10.

The charging/discharging voltage is inputted from the feedback circuit 20 to the charge pump circuit 10 according to the first embodiment, and a clock signal CK to be supplied from the outside is inputted as the oscillation signal to the charge pump circuit 10. The charge pump circuit 10 outputs a voltage in response to the CP control signal as an output voltage Vout to an output pad 13. An external capacitor Cex is connected to the output pad 13.

The feedback circuit 20 autonomously adjusts a voltage relation among the first to third nodes so as to satisfy a relation of the first node N1>the second node N2 (constant voltage)>the third node N3.

The feedback circuit 20 has a voltage adjusting circuit 40 acting so as to autonomously adjust an output voltage Vout such that a second voltage V2 at the second node N2 becomes a constant voltage (e.g., 0 V) between the first node N1 and the second node N2.

The voltage adjusting circuit 40, for example, includes a current source 41, a MOS transistor element 42, and a bias circuit 43.

The current source 41 is provided between the first node N1 and a high-potential side constant voltage source VDD, and generates a current I which flows from the high-potential side constant voltage source VDD to the first node N1. A value of the current I which the current source 41 flows is controlled by the control section 30.

The MOS transistor element 42 is configured by interposing source-drain connection in the feedback path P between the first node N1 and the second node N2. In other words, the first node N1 and the second node N2 are connected to each other via the MOS transistor element 42. The MOS transistor element 42 is interposed between the first node N1 and the second node N2 in the feedback path P in such a way that the drain thereof is connected to the first node N1 and the source thereof is connected to the second node N2.

The bias circuit 43 applies the ON-voltage Von to a gate as a control terminal of the MOS transistor element 42. When a gate-source voltage of the MOS transistor element 42 is set to be Vgs, the ON-voltage Von is set to be a voltage higher than the second voltage V2 at the second node N2 by a value equivalent to the gate-source voltage Vgs. In the MOS transistor element 42 having the gate to which a voltage (V2+Vgs) is applied, a voltage of the source is controlled to be the second voltage V2.

The current I generated by the current source 41 flows from the first node N1 to the second node N2 via the MOS transistor element 42. A voltage VDS is generated across the source and the drain of the MOS transistor element 42. More specifically, the first voltage V1 at the first node N1 becomes a voltage higher than the second voltage V2 at the second node N2 by the voltage VDS.

A potential difference forming circuit 50 is provided between the second node N2 and the third node N3. The potential difference forming circuit 50 forms a potential difference obtained as a result of setting the second voltage V2 at the second node N2 which is the constant voltage V2 as a reference voltage and then setting a third voltage V3 at the third node N3 to a lower voltage than the second voltage V2.

The potential difference forming circuit 50 can, for example, include a current source 51 (common to a current source 41 in the first embodiment) and a resistor 52 (hereinafter, a resistance value is set as ZF). The feedback path P between the second node N2 and the third node N3 is connected via a resistor 52.

The current I generated by the current source 51 flows from the second node N2 to the third node N3 via the resistor 52. As depicted in following Equation (1), a voltage VZF in response to the current I and the resistance value ZF is generated in the resistor 52. The third voltage V3 at the third node N3 becomes a voltage lower than the second voltage V2 at the second node N2 by the voltage VZF.

[Math. 1]

$$V_{ZF}=I \times ZF \tag{1}$$

The control section 30 controls the value of the current I generated by the current source 41 (current source 51). The current source 41 (current source 51) and the control section 30, for example, are configured in the form of a current mirror circuit.

Since the power supply circuit 100 described so far does not use the operational amplifier, the power supply circuit 100 can perform a low-voltage operation, and a circuit area can be reduced compared with the conventional power supply circuit while the stability is realized. In addition, since the power supply circuit 100 does not use the voltage division circuit, there is no increase in circuit area resulting from a level shifter.

Moreover, the conventional voltage feedback type charge pump circuit using the operational amplifier adopts a three-pole system, and there is a strong dependency relation between a second pole and a third pole. Therefore, although a relation between the first pole and the second pole can be improved by performing scaling with a constant current density, in this case, a relation between the second pole and the third pole becomes worse. In contrast, since the current feedback type power supply circuit according to the first embodiment adopts a two-pole system, the relation between the first pole and the second pole can be improved by performing the scaling with the constant current density with attention to only the second pole.

More specifically, in the power supply circuit 100 according to the first embodiment, the second pole P2 can be shifted to a high frequency side by performing the current scaling with the gain-bandwidth product being held constant. Therefore, the current scaling can be performed without generating the trade-off with a phase margin.

(B) Second Embodiment

Figure 2:
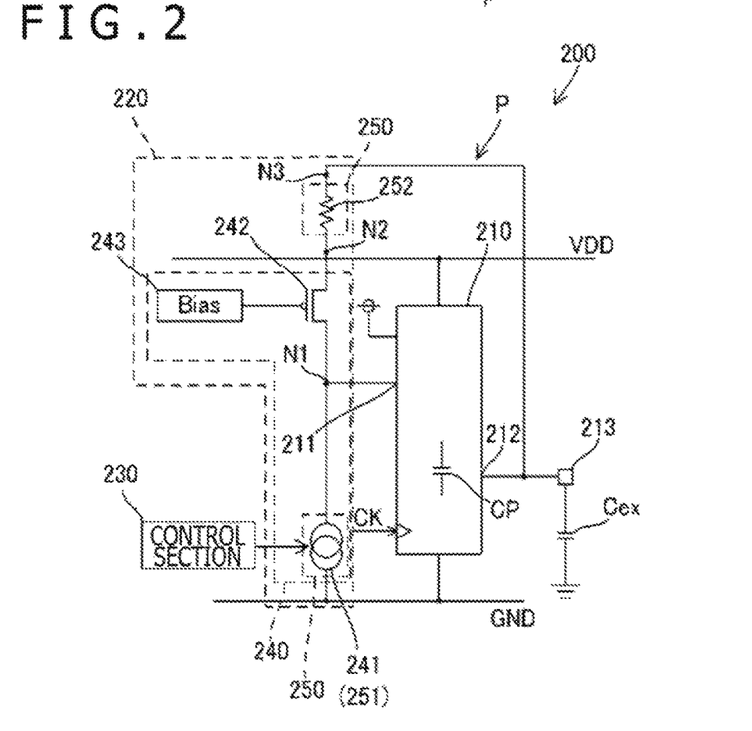
FIG. 2 is a circuit diagram depicting a schematic configuration of a power supply circuit according to a second embodiment.

FIG. 2 is a circuit diagram of assistance in explaining a power supply circuit according to a second embodiment. The power supply circuit 200 is a current feedback type charge pump circuit which generates an output voltage which is obtained by boosting an input voltage, and includes a charge pump circuit 210, and a feedback circuit 220, and a control section 230.

The feedback circuit 220 forms a feedback path P connecting an output section 212 of the charge pump circuit 210, and an input section 211 of the charge pump circuit 210.

The feedback path P of the feedback circuit 220 has a first node N1 connected to the input section 211 of the charge pump circuit 210, a third node N3 connected to the output section 212 of the charge pump circuit 210, and a second node N2 provided between the first node N1 and the third node N3.

A charging/discharging voltage to be used in the charge/discharge of a capacitor CP holding the charge pump charges, and an oscillation signal for switching control of ON/OFF of a switching element switching a charge/discharge direction to the capacitor CP are supplied to the charge pump circuit 210, and the charge pump circuit 210 outputs a voltage in response to the charging/discharging voltage and the oscillation signal. In the following, the charging/discharging voltage and the oscillation signal which are inputted to the charge pump circuit 210 are collectively referred to as a CP control signal.

In addition thereto, if necessary, a reference voltage to be used in the charge/discharge of the capacitor CP is suitably supplied from an arbitrary bias source to the charge pump circuit 210.

The charging/discharging voltage is inputted from the feedback circuit 220 to the charge pump circuit 210 according to the second embodiment, and a clock signal CK to be supplied from the outside is inputted as the oscillation signal to the charge pump circuit 210. The charge pump circuit 210 outputs a voltage in response to the CP control signal as an output voltage Vout to an output pad 213. An external capacitor Cex is connected to the output pad 213.

The feedback circuit 220 autonomously adjusts a voltage relation among the first to third nodes so as to satisfy a relation of the third node N3>the second node N2 (constant voltage)>the first node N1.

The feedback circuit 220 has a voltage adjusting circuit 240 acting so as to autonomously adjust an output voltage Vout such that a second voltage V2 at the second node N2 becomes a constant voltage (e.g., the potential of the high-potential side constant voltage source VDD) between the first node N1 and the second node N2.

The voltage adjusting circuit 240, for example, includes a current source 241, a MOS transistor element 242, and a bias circuit 243.

The current source 241 is provided between the first node N1 and the low-potential side constant voltage source GND, and generates a current I which flows from the first node N1 toward the low-potential side constant voltage source GND. A value of the current I which the current source 241 flows is controlled by the control section 230.

The MOS transistor element 242 is configured by interposing source-drain connection in the feedback path P between the first node N1 and the second node N2. More specifically, the first node N1 and the second node N2 are connected to each other via the MOS transistor element 242. The MOS transistor element 242 is interposed between the first node N1 and the second node N2 in the feedback path P in such a way that the drain thereof is connected to the first node N1 and the source thereof is connected to the second node N2.

The bias circuit 243 applies the ON-voltage Von to a gate as a control terminal of the MOS transistor element 242. When a gate-source voltage of the MOS transistor element 242 is set to be Vgs, the ON-voltage Von is set to be a voltage lower than the second voltage V2 at the second node N2 by a value equivalent to the gate-source voltage Vgs. As a result, in the MOS transistor element 242 having the gate to which a voltage (V2−Vgs) is applied, a voltage of the source is controlled to be the second voltage V2.

The current I generated by the current source 241 flows through the MOS transistor element 242 from the second node N2 to reach the current source 241 via the first node N1. A voltage VDS is generated across the source and the drain of the MOS transistor element 242. That is, the second voltage V2 at the second node N2 becomes a voltage higher than the first voltage V1 at the first node N1 by the voltage VDS.

A potential difference forming circuit 250 is provided between the second node N2 and the third node N3. The potential difference forming circuit 250 forms a potential difference obtained as a result of setting the second voltage V2 at the second node N2 which is the constant voltage V2 as a reference voltage and then setting the third voltage V3 at the third node N3 to a higher voltage than the second voltage V2.

The potential difference forming circuit 250 can, for example, include a current source 251 (common to a current source 241 in the second embodiment) and a resistor 252 (hereinafter, a resistance value is set as ZF). The feedback path P between the second node N2 and the third node N3 is connected via a resistor 252.

The current I generated by the current source 251 flows from the third node N3 to the second node N2 via the resistor

252. As depicted in following Equation (2), a voltage VZF in response to the current I and the resistance value ZF is generated in the resistor 252. The third voltage V3 at the third node N3 becomes a voltage higher than the second voltage V2 at the second node N2 by the voltage VZF.

[Math. 2]

$$V_{ZF} = I \times ZF \qquad (2)$$

The control section 230 controls the value of the current I generated by the current source 241 (current source 251). The current source 241 (current source 251) and the control section 230, for example, include a current mirror circuit.

Similarly to the power supply circuit according to the first embodiment described above, also in the power supply circuit according to the second embodiment described so far, since the operational amplifier is not used, the low-voltage operation can be performed, and the circuit area can be reduced compared with the conventional power supply circuit while the stability is realized. In addition, since the voltage division circuit is not used, there is no increase in circuit area resulting from the level shifter. In addition, the second pole P2 can be shifted to the high-frequency side by performing the current scaling with the gain-bandwidth product being held constant. Therefore, the current scaling can be performed without generating the trade-off with a phase margin.

(C) Third Embodiment

Figure 3:
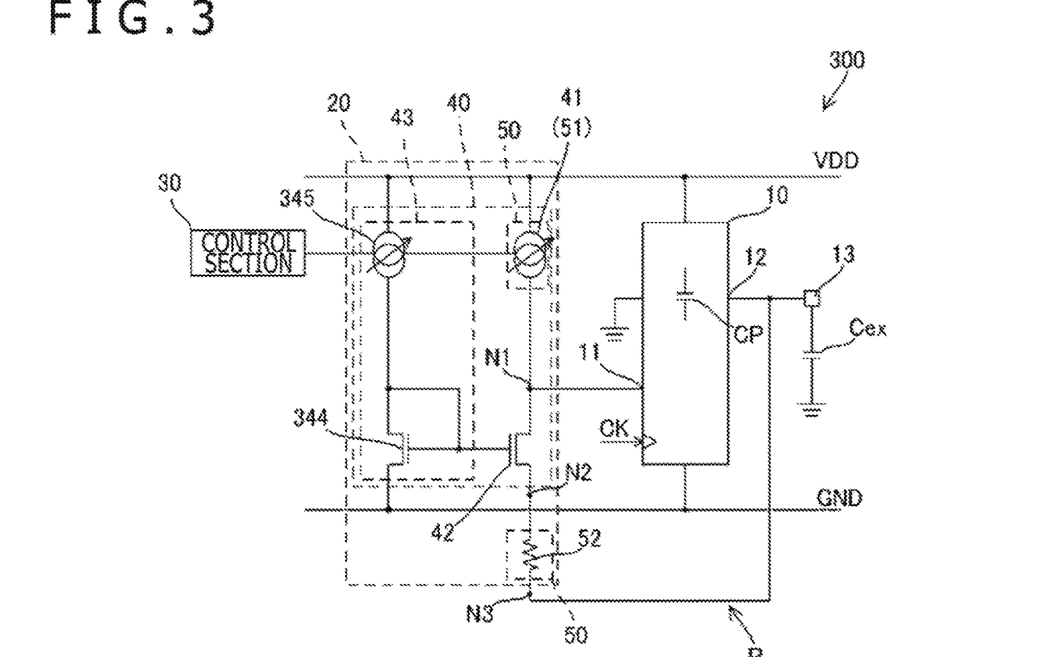
FIG. 3 is a circuit diagram depicting a schematic configuration of a power supply circuit according to a third embodiment.

FIG. 3 is a circuit diagram of assistance in explaining a power supply circuit according to a third embodiment.

A power supply circuit 300 according to the third embodiment is an example of a configuration in which the bias circuit 43 and the current source 41 (current source 51) of the power supply circuit 100 according to the first embodiment are realized in the form of a current mirror circuit. In the following, constituent elements common to those of the first embodiment are denoted by the same reference numerals, and a detailed description thereof is omitted.

The current mirror circuit depicted in the figure adopts a basic configuration of a current mirror circuit in which a gate of the MOS transistor element 344 having the same characteristic as the MOS transistor element 42 is connected to the gate of the MOS transistor element 42, the gate and a drain of the MOS transistor element 344 are short-circuited, a source of the MOS transistor element 344 is connected to a low-potential side constant voltage source GND, and the drain of the MOS transistor element 344 and a high-potential side constant voltage source VDD are connected by a current source 345. It is to be noted that the configuration of the current mirror circuit provided in the power supply circuit 300 according to the third embodiment is not limited to the basic configuration and can be variously changed.

In addition, the current source 345 adopts a configuration in which, in order to cause the same current I as that of the current source 41 (current source 51) to flow, a current value is controlled in accordance with the same control signal from the same control section 30. That is, the control signal from the control section 30 is made variable, resulting in that the values of the currents I from both the current source 345 and the current source 41 (current source 51) can be easily adjusted. In addition, in the power supply circuit 300 according to the third embodiment, a bias circuit 343 can be realized in a simple configuration.

(D) Fourth Embodiment

Figure 4:
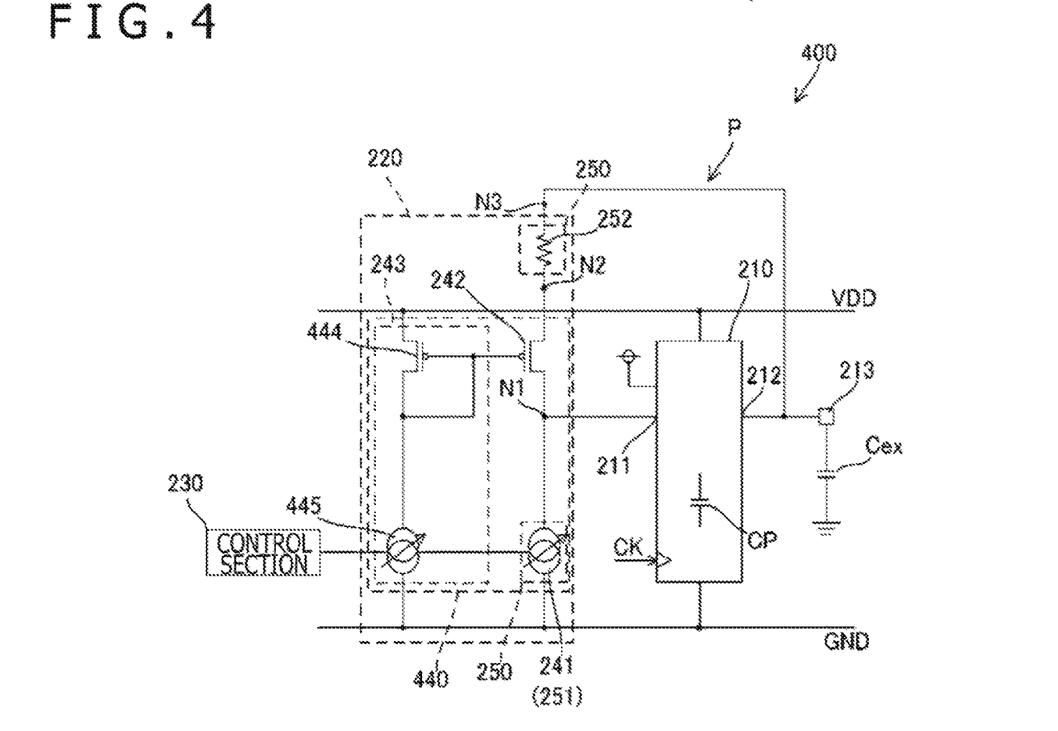
FIG. 4 is a circuit diagram depicting a schematic configuration of a power supply circuit according to a fourth embodiment.

FIG. 4 is a circuit diagram of assistance in explaining a power supply circuit according to a fourth embodiment.

A power supply circuit 400 according to the third embodiment is an example of a configuration in which the bias circuit 243 and the current source 241 (current source 251) of the power supply circuit 200 according to the second embodiment are specifically realized in the form of a current mirror circuit. In the following, constituent elements common to those of the second embodiment are denoted by the same reference signs, and a detailed description thereof is omitted.

The current mirror circuit depicted in the figure adopts a basic configuration of a current mirror circuit in which a gate of the MOS transistor element 444 having the same characteristic as the MOS transistor element 242 is connected to the gate of the MOS transistor element 242, the gate and a drain of the MOS transistor element 444 are short-circuited, a source of the MOS transistor element 444 is connected to a high-potential side constant voltage source VDD, and the drain of the MOS transistor element 444 and a high-potential side constant voltage source VDD are connected by a current source 445. It is to be noted that the configuration of the current mirror circuit provided in the power supply circuit 400 according to the fourth embodiment is not limited to the basic configuration and can be variously changed.

In addition, the current source 445 adopts a configuration in which, in order to cause the same current I as that of the current source 241 (current source 251) to flow, a current value is controlled in accordance with the same control signal from the same control section 230. That is, the control signal from the control section 230 is made variable, resulting in that the values of the currents I from both the current source 445 and the current source 241 (current source 251) can be easily adjusted. In addition, in the power supply circuit 400 according to the fourth embodiment, a bias circuit 243 can be realized in a simple configuration.

(E) Fifth Embodiment

Figure 5:
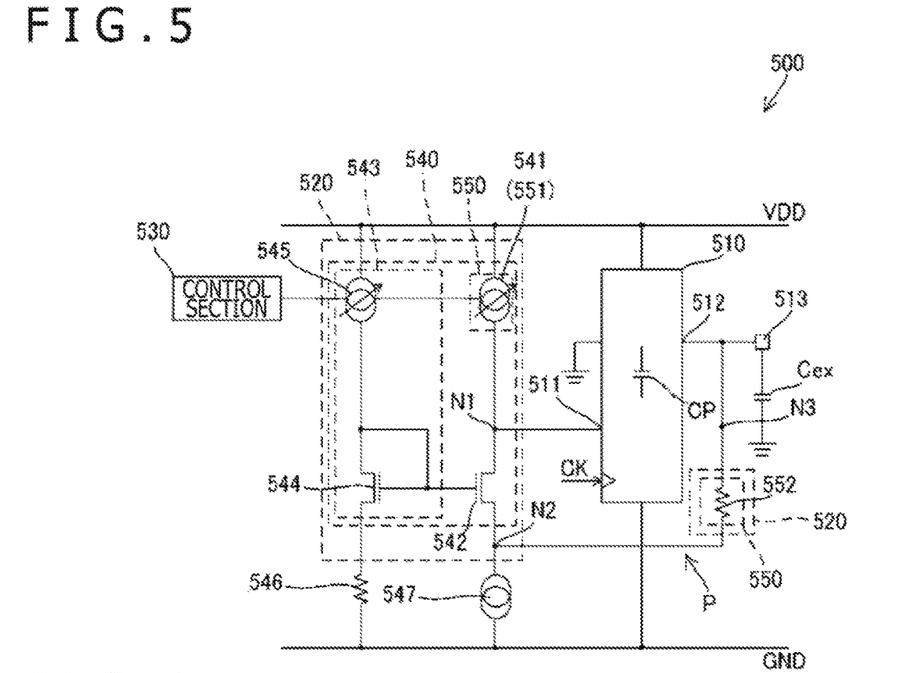
FIG. 5 is a circuit diagram depicting a schematic configuration of a power supply circuit according to a fifth embodiment.

FIG. 5 is a circuit diagram of assistance in explaining a power supply circuit according to a fifth embodiment. The power supply circuit 500 according to the fifth embodiment is a current feedback type charge pump circuit which generates an output voltage obtained by boosting an input voltage, and includes a charge pump circuit 510, a feedback circuit 520, and a control section 530.

The feedback circuit 520 forms the feedback path P connecting an output section 512 of the charge pump circuit 510 and an input section 511 of the charge pump circuit 510.

The feedback path P of the feedback circuit 520 has a first node N1 connected to the input section 511 of the charge pump circuit 510, a third node N3 connected to the output section 512 of the charge pump circuit 510, and a second node N2 provided between the first N1 and the third node N3.

A charging/discharging voltage to be used in the charge/discharge of the capacitor CP holding the charge pump charges, and an oscillation signal for switching-control of ON/OFF of a switching element switching a charge/discharge direction to the capacitor CP are supplied to the charge pump circuit 510, and the charge pump circuit 510 outputs a voltage in response to the charging/discharging voltage and the oscillation signal.

In addition thereto, if necessary, a reference voltage to be used in the charge/discharge of the capacitor CP is suitably supplied from an arbitrary bias source to the charge pump circuit 510.

The charging/discharging voltage is inputted to from the feedback circuit 520 to the charge pump circuit 510 according to the fifth embodiment, and a clock signal CK to be supplied from the outside is inputted as an oscillation signal to the charge pump circuit 510. In the following, the charging/discharging voltage and the oscillation signal which are inputted to the charge pump circuit 510 are collectively referred to as a CP control signal. The charge pump circuit 510 outputs a voltage in response to the CP control signal as an output voltage Vout to an output pad 513. An external capacitor Cex is connected to the output pad 513.

The feedback circuit 520 autonomously adjusts a voltage relation among the first to third nodes so as to satisfy a relation of the third node N3>the first node N1>the second node N2 (constant voltage).

The feedback circuit 520 has a voltage adjusting circuit 540 acting so as to autonomously adjust an output voltage Vout such that a second voltage V2 at the second node N2 becomes a constant voltage (e.g., a voltage generated as a result of the current I flowing through a resistor 546, to be described later) between the first node N1 and the second node N2.

The voltage adjusting circuit 540, for example, includes a current source 541, a MOS transistor element 542, and a bias circuit 543.

The current source 541 is provided between the first node N1 and the high-potential side constant voltage source VDD, and generates the current I which flows from the high-potential side constant voltage source VDD to the first node N1. A value of the current I which the current source 541 flows is controlled by the control section 530.

The feedback path P between the first node N1 and the second node N2 is configured with source-drain connection of the MOS transistor element 542 interposed between the first node N1 and the second node N2, and the first node N1 and the second node N2 are connected via the MOS transistor element 542. The MOS transistor element 542 is interposed between the first node N1 and the second node N2 of the feedback path P such that the drain is connected to the first node N1 and the source is connected to the second node N2.

The bias circuit 543 applies the ON-voltage Von to a gate as a control terminal of the MOS transistor element 542. When a gate-source voltage of the MOS transistor element 542 is set to be Vgs, the ON-voltage Von is a voltage higher than the second voltage V2 at the second node N2 by a value equivalent to the gate-source voltage Vgs. As a result, in the MOS transistor element 542 having the gate to which a voltage (V2+Vgs) is applied, a voltage of the source is controlled to be the second voltage V2.

The bias circuit 543 has a configuration of a current mirror circuit. The bias circuit 543 having the configuration of the current mirror circuit has a basic current mirror circuit in which a gate of the MOS transistor element 544 having the same characteristic as the MOS transistor element 542 is connected to the gate of the MOS transistor element 542, the gate and a drain of the MOS transistor element 544 are short-circuited, a source of the MOS transistor element 544 is connected to a low-potential side constant voltage source GND via the resistor 546, and the drain of the MOS transistor element 544 and a high-potential side constant voltage source VDD are connected by a current source 545. It is to be noted that the configuration of the current mirror circuit is not limited to the basic configuration.

In addition, the current source 545 adopts the configuration in which, in order to cause the same current I as that of the current source 541 (current source 551) to flow, a current value is controlled in accordance with the same control signal from the same control section 530. That is, the control signal from the control section 530 is made variable, resulting in that the values of the currents I from both the current source 545 and the current source 541 (current source 551) can be easily adjusted. In addition, in the power supply circuit 500 according to the fifth embodiment, a bias circuit 543 can be realized in a simple configuration.

The current I generated by the current source 541 flows from the first node N1 to the second node N2 via the MOS transistor element 542. A voltage VDS is generated across the source and the drain of the MOS transistor element 542. That is, a first voltage V1 at the first node N1 becomes a voltage higher than the second voltage V2 at the second node N2 by the voltage VDS.

The second node N2 is connected to the low-potential side constant voltage GND via a current source 547 as a second current source. The current source 547 generates a current I' which flows from the second node N2 to the low-potential side constant voltage GND. For this reason, the current I which the current source 541 flows through the MOS transistor element 542 via the first node N1 is caused to flow to the low-potential side constant voltage GND via the current source 547.

A potential difference forming circuit 550 is provided between the second node N2 and the third node N3. The potential difference forming circuit 550 forms a potential difference obtained as a result of setting the second voltage V2 at the second node N2 which is the constant voltage as a reference voltage and then setting a third voltage V3 at the third node N3 to a higher voltage than the second voltage V2. Moreover, the potential difference, between the second node N2 and the third node N3, which is formed by the potential difference forming circuit 550, is made larger than the potential difference, between the second node N2 and the first node N1, which is formed by the MOS transistor element 542.

The potential difference forming circuit 550 can, for example, include a current source 551 (common to a current source 541 in the fifth embodiment) and a resistor 552 (hereinafter, a resistance value is set as ZF). The feedback path P between the second node N2 and the third node N3 is connected via a resistor 552.

Due to the current I' generated by the current source 547, a current flowing from the third node N3 toward the second node N2 flows in the resistor 552. As depicted in the following Equation (3), a voltage VZF depending on a current (I−I') and the resistance value ZF is generated in the resistor 552. The third voltage V3 at the third node N3 becomes a voltage higher than the second voltage V2 at the second node N2 by the voltage VZF.

[Math. 3]

$$V_{ZF} = (I-I') \times ZF \tag{3}$$

The control section 530 controls the values of the currents I generated by the current source 541 (current source 551) and the current source 545. The current source 541 (current source 551) and the current source 545, and the control section 530, for example, are configured in the form of a current mirror circuit.

Similarly to the power supply circuit according to the first embodiment described above, also in the power supply circuit according to the fifth embodiment described above, since the operational amplifier is not used, the low-voltage operation can be performed, and the circuit area can be reduced compared with the conventional power supply circuit while the stability is realized. In addition, since the voltage division circuit is not used, there is no increase in circuit area resulting from the level shifter. In addition, the second pole P2 can be shifted to the high-frequency side by performing the current scaling with the gain-bandwidth product being held constant. Therefore, the current scaling can be performed without generating the trade-off with a phase margin.

(F) Sixth Embodiment

Figure 6:
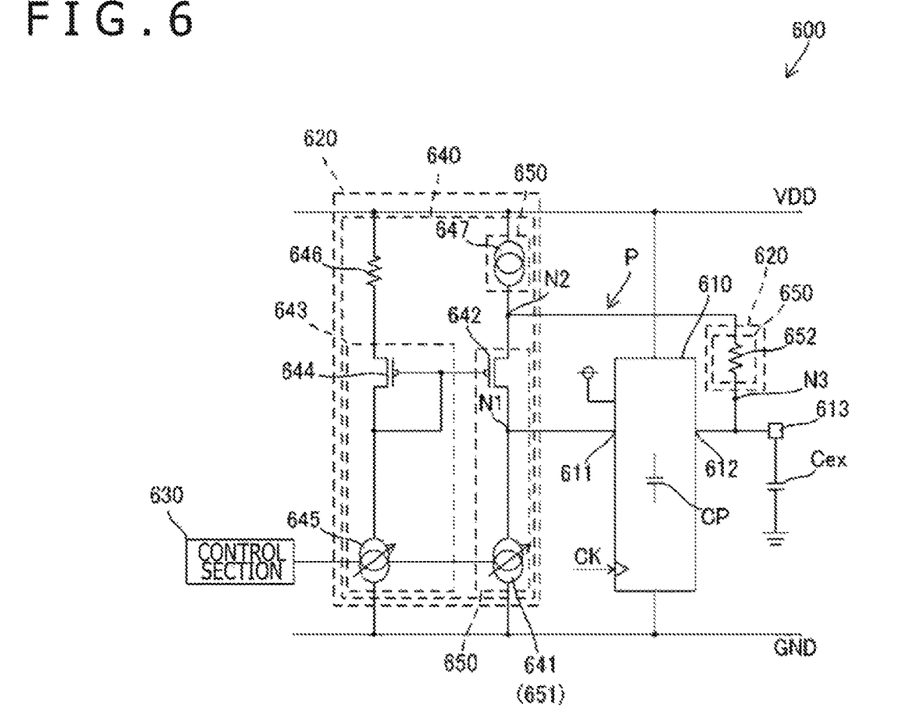
FIG. 6 is a circuit diagram depicting a schematic configuration of a power supply circuit according to a sixth embodiment.

FIG. 6 is a circuit diagram of assistance in explaining a power supply circuit according to a sixth embodiment. The power supply circuit 600 according to the sixth embodiment is a current feedback type charge pump circuit which generates an output voltage obtained by boosting an input voltage, and includes a charge pump circuit 610, a feedback circuit 620, and a control section 630.

The feedback circuit 620 forms the feedback path P connecting an output section 612 of the charge pump circuit 610 and an input section 611 of the charge pump circuit 610. The feedback path P of the feedback circuit 620 has a first node N1 connected to the input section 611 of the charge pump circuit 610, a third node N3 connected to the output section 612 of the charge pump circuit 610, and a second node N2 provided between the first N1 and the third node N3.

A charging/discharging voltage to be used in the charge/discharge of a capacitor CP holding the charge pump charges, and an oscillation signal for switching-control of ON/OFF of a switching element switching a charge/discharge direction to the capacitor CP are supplied to the charge pump circuit 610, the charge pump circuit 610 outputs a voltage in response to the charging/discharging voltage and the oscillation signal. In the following, the charging/discharging voltage and the oscillation signal which are inputted to the charge pump circuit 610 are collectively referred to as a CP control signal.

In addition thereto, if necessary, a reference voltage to be used in the charge/discharge of the capacitor CP is suitably supplied from an arbitrary bias source to the charge pump circuit 610.

The charging/discharging voltage is inputted to from the feedback circuit 620 to the charge pump circuit 610 according to the sixth embodiment, and a clock signal CK to be supplied from the outside is inputted as an oscillation signal to the charge pump circuit 610. The charge pump circuit 610 outputs a voltage in response to the CP control signal as an output voltage Vout to an output pad 613. An external capacitor Cex is connected to the output pad 613.

The feedback circuit 620 autonomously adjusts a voltage relation among the first to third nodes so as to satisfy a relation of the second node N2 (constant voltage)>the first node N1>the third node N3.

The feedback circuit 620 has a voltage adjusting circuit 640 acting so as to autonomously adjust an output voltage Vout such that a second voltage V2 at the second node N2 becomes a constant voltage (e.g., a voltage generated as a result of the current I flowing through the resistor 646, to be described later) between the first node N1 and the second node N2.

The voltage adjusting circuit 640, for example, includes a current source 641, a MOS transistor element 642, and a bias circuit 643.

The current source 641 is provided between the first node N1 and the low-potential side constant voltage source GND, and generates the current I which flows from the first node N1 to the low-potential side constant voltage source GND.

A value of the current I which the current source 641 flows is controlled by the control section 630.

The feedback path P between the first node N1 and the second node N2 is configured with source-drain connection of the MOS transistor element 642 interposed between the first node N1 and the second node N2, and the first node N1 and the second node N2 are connected via the MOS transistor element 642. The MOS transistor element 642 is interposed between the first node N1 and the second node N2 of the feedback path P such that the source is connected to the second node N2 and the drain is connected to the first node N1.

The bias circuit 643 applies the ON-voltage Von to a gate as a control terminal of the MOS transistor element 642. When a gate-source voltage of the MOS transistor element 642 is set to be Vgs, the ON-voltage Von is set to be a voltage lower than the second voltage V2 at the second node N2 by a value equivalent to the gate-source voltage Vgs. As a result, in the MOS transistor element 642 having the gate to which a voltage (V2−Vgs) is applied, a voltage of the source is controlled to be the second voltage V2.

Figure 7:
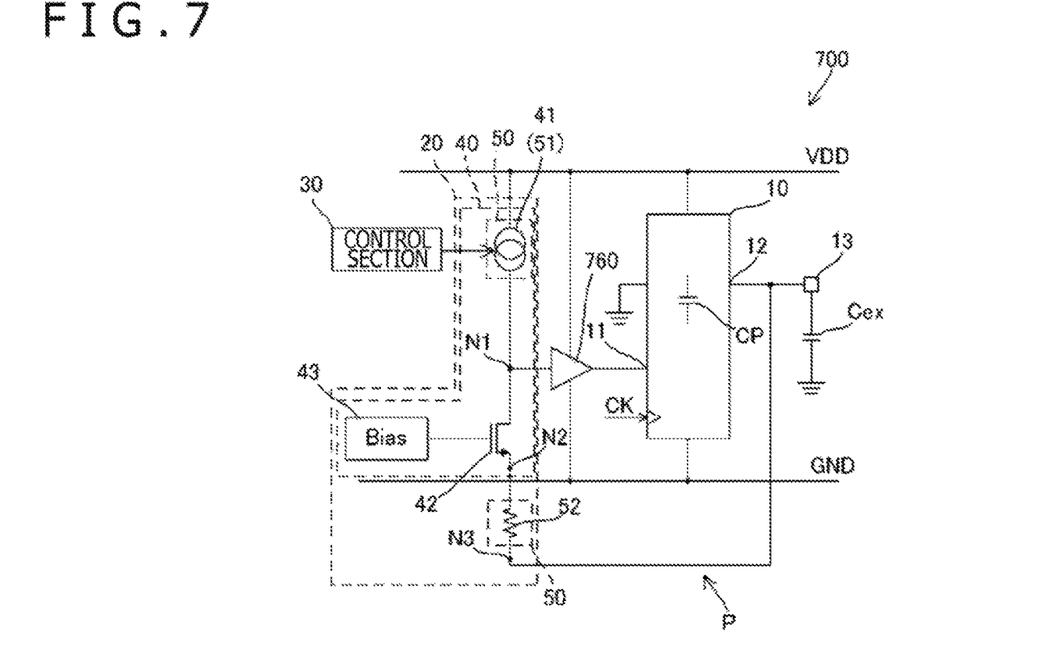
FIG. 7 is a circuit diagram depicting a schematic configuration of a power supply circuit according to a seventh embodiment.

The bias circuit 643 has a configuration of a current mirror circuit. In FIG. 7, there is illustrated a basic configuration of a current mirror circuit, as the bias circuit 643 having the basic configuration of the current mirror circuit in which a gate of the MOS transistor element 644 having the same characteristic as the MOS transistor element 642 is connected to the gate of the MOS transistor element 642, the gate and a drain of the MOS transistor element 644 are shorted, a source of the MOS transistor element 644 is connected to a high-potential side constant voltage source VDD via the resistor 646, and the drain of the MOS transistor element 644 and a low-potential side constant voltage source GND are connected by a current source 645. It is to be noted that the configuration of the current mirror circuit provided in the power supply circuit 600 according to the sixth embodiment is not limited to the basic configuration and can be variously changed.

In addition, current values of the current source 645 and the current source 641 (current source 651) are controlled in accordance with the control by the same control section 630. That is, the values of the currents I which the current source 645 and the current source 641 (current source 651) flow are adjusted to the same value in accordance with the control by the control section 630.

The current I generated by the current source 641 flows from the second node N2 to the first node N1 via the MOS transistor element 642. A voltage VDS is generated across the source and the drain of the MOS transistor element 642. That is, a first voltage V1 at the first node N1 becomes a voltage lower than the second voltage V2 at the second node N2 by the voltage VDS.

The second node N2 is connected to the high-potential side constant voltage source VDD via the current source 647 as the second current source. The current source 647 generates a current I' which flows from the high-potential side constant voltage source VDD to the second node N2. For this reason, a current I which the current source 641 flows from the second node N2 to the first node N1 through the MOS transistor element 642 constitutes a part of the current I'.

A potential difference forming circuit 650 is provided between the second node N2 and the third node N3. The potential difference forming circuit 650 forms a potential difference obtained as a result of setting the second voltage V2 at the second node N2 which is the constant voltage as the reference voltage and then setting a third voltage V3 at the third node N3 to a lower voltage than the second voltage V2.

The potential difference forming circuit 650 can, for example, include a current source 651 (common to the current source 641 in the sixth embodiment) and a resistor 652 (hereinafter, a resistance value is set as ZF). The feedback path P between the second node N2 and the third node N3 is connected via a resistor 652.

Due to the current I' which the current source 647 generates, a current flowing from the second node N2 toward the third node N3 flows in the resistor 652. As depicted in the following Equation (4), a voltage VZF depending on a current (I'-I) and the resistance value ZF is generated in the resistor 652. The third voltage V3 at the third node N3 becomes a voltage lower than the second voltage V2 at the second node N2 by the voltage VZF.

[Math. 4]

$$V_{ZF} = (I'-I) \times ZF \quad (4)$$

The control section 630 controls the values of the currents I generated by the current source 641 (current source 651) and the current source 645. The current source 641 (current source 651) and the current source 645, and the control section 630, for example, are configured in the form of a current mirror circuit.

Similarly to the power supply circuit according to the first embodiment described above, also in the power supply circuit according to the sixth embodiment described so far, since the operational amplifier is not used, the low-voltage operation can be performed, and the circuit area can be reduced compared with the conventional power supply circuit while the stability is realized. In addition, since the voltage division circuit is not used, there is no increase in circuit area resulting from the level shifter. In addition, the second pole P2 can be shifted to the high-frequency side by performing the current scaling with the gain-bandwidth product being held constant. Therefore, the current scaling can be performed without generating the trade-off with a phase margin.

(G) Seventh Embodiment

FIG. 7 is a circuit diagram of assistance in explaining a power supply circuit according to a seventh embodiment. The power supply circuit 700 according to the seventh embodiment adopts a configuration in which a first voltage V1 at a first node N1 is inputted to a charge pump circuit 10 via a buffer 760.

It is to be noted that, although FIG. 7 depicts an example in which the buffer 760 is provided in the power supply circuit 100 according to the first embodiment, the buffer 760 may be provided in any of the power supply circuits according to the second to sixth embodiments. In addition, the charge pump circuit 10 may incorporate the buffer 760.

A configuration is adopted in which supply of the charging/discharging voltage from the first node N1 to the charge pump circuit 10 is performed via the buffer 760, resulting in that a large current necessary for driving a heavy load by the charge pump circuit 10 can be secured while an influence on the output of the charge pump circuit 10 is made small as much as possible.

That is, in a case where the charge pump circuit 10 needs a large current, the sufficient charges can be supplied to a capacitor CP of the charge pump circuit 10 without causing the large current to flow to a feedback path P. In addition, since it is not necessary to flow a large current to the feedback path P, an influence of the current source 41 on the charge/discharge for an external capacitor Cex which is charged/discharged by an output of the charge pump circuit 10 can be kept small as much as possible, and the current source 41 does not need to become a load for an external capacitor Cex.

(H) Eighth Embodiment

Figure 8:
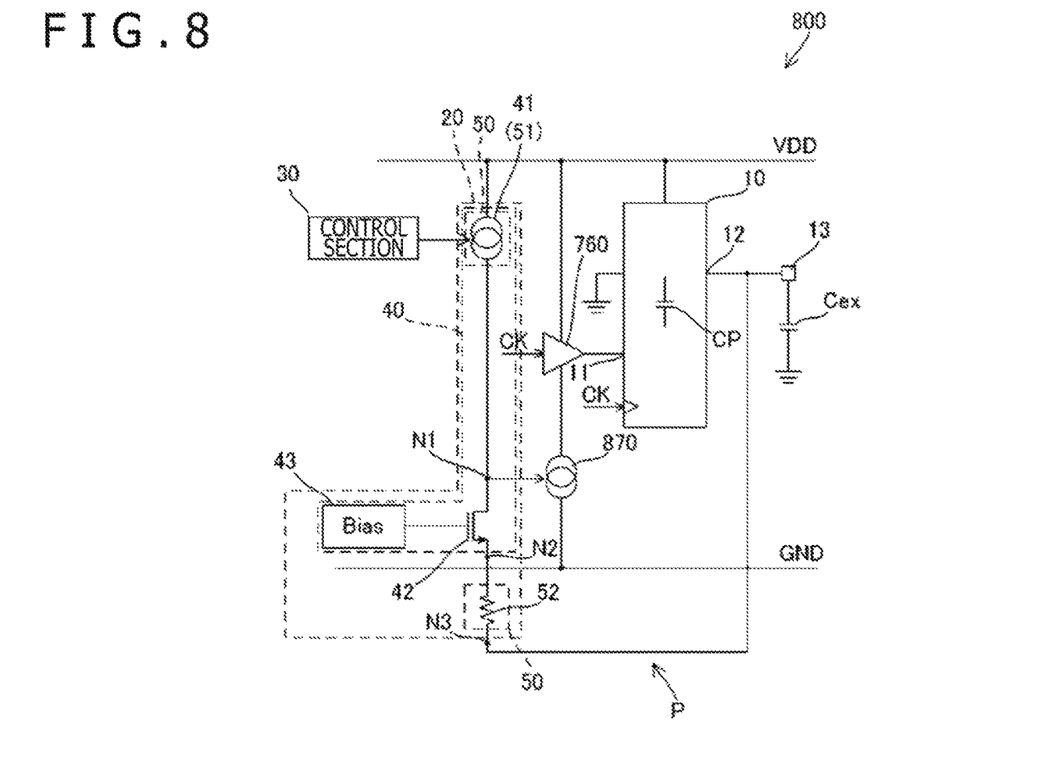
FIG. 8 is a circuit diagram depicting a schematic configuration of a power supply circuit according to an eighth embodiment.

FIG. 8 is a circuit diagram of assistance in explaining a power supply circuit according to an eighth embodiment. The power supply circuit 800 according to the eighth embodiment adopts a configuration in which a current source 870 as a third current source is interposed on a line along which the low-potential side constant voltage GND is supplied to the buffer 760 provided in the charge pump circuit 10 according to the seventh embodiment described above, and a first voltage V1 at a first node N1 is used as a control signal in accordance with which a current value of the current source 870 is made variable. The buffer 760, for example, receives an external clock signal CK as an input.

In this manner, the configuration in which the current supply to the buffer 760 is controlled by using the first voltage V1 at the first node N1 is adopted. Accordingly, in an idle state in which the load of the charge pump circuit 10 is light and the current which should be supplied to the charge pump circuit 10 is small, the current flowing through the buffer 760 can be suppressed to perform power saving operation. Conversely, in a case where the load of the charge pump circuit 10 is heavy and an ability to drive the charge pump circuit 10 needs to be increased, the current flowing through the buffer 760 is increased, and thus, a large current can be supplied to the charge pump circuit. That is, the power supply circuit 800 is realized which automatically adjusts the current supplied to the charge pump circuit 10 depending on the state of the load.

(I) Ninth Embodiment

Figure 9:
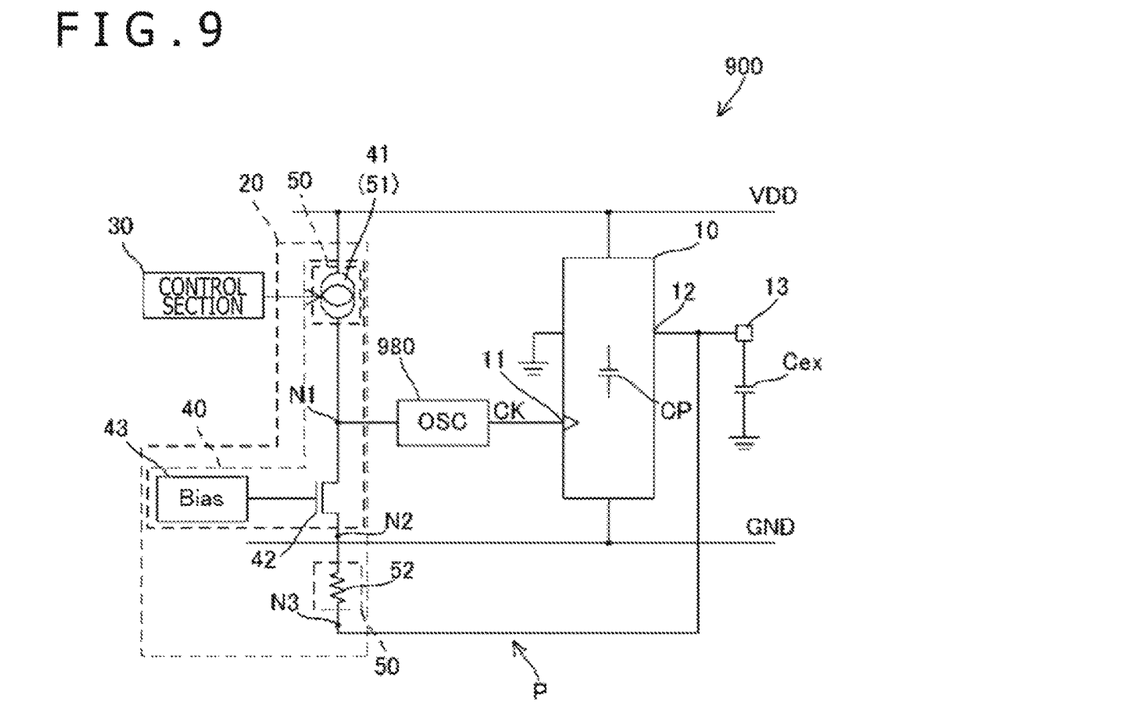
FIG. 9 is a circuit diagram depicting a schematic configuration of a power supply circuit according to a ninth embodiment.

FIG. 9 is a circuit diagram of assistance in explaining a power supply circuit according to a ninth embodiment. A power supply circuit 900 according to the ninth embodiment adopts a configuration in which an oscillation signal CK outputted by an oscillator 980 presence or absence of oscillation of which is controlled by a first voltage V1 at the first node N1 is supplied to the charge pump circuit 10.

It is to be noted that, although FIG. 9 depicts an example in which the oscillator 980 is provided in the power supply circuit 100 according to the first embodiment, the oscillator 980 may be provided in the power supply circuit according to any of the second to sixth embodiments. In addition, the charge pump circuit 10 may incorporate the oscillator 980.

When the first voltage V1 at the first node N1 becomes equal to or larger than a given threshold value, the oscillator 980 supplies the oscillation signal CK to the charge pump circuit 10, and in a case where the first voltage V1 at the first node N1 is smaller than the given threshold value, the oscillator 980 stops the output of the oscillation signal CK. The oscillation signal CK which the oscillator 980 supplies to the charge pump circuit 10 is used to the control for switching of ON/OFF of the switching element which switches the charge/discharge direction for the capacitor CP.

In the power supply circuit 900 configured in such a manner, there is adopted the configuration in which, only when necessary, switching of switching groups is performed to charge/discharge for the capacitor CP, and the charge/ discharge is carried out from the charge pump circuit 10 to the external capacitor Cex. Therefore, in a case where the load of the charge pump circuit 10 is small, power saving operation can be efficiently realized.

(J) Tenth Embodiment

Figure 10:
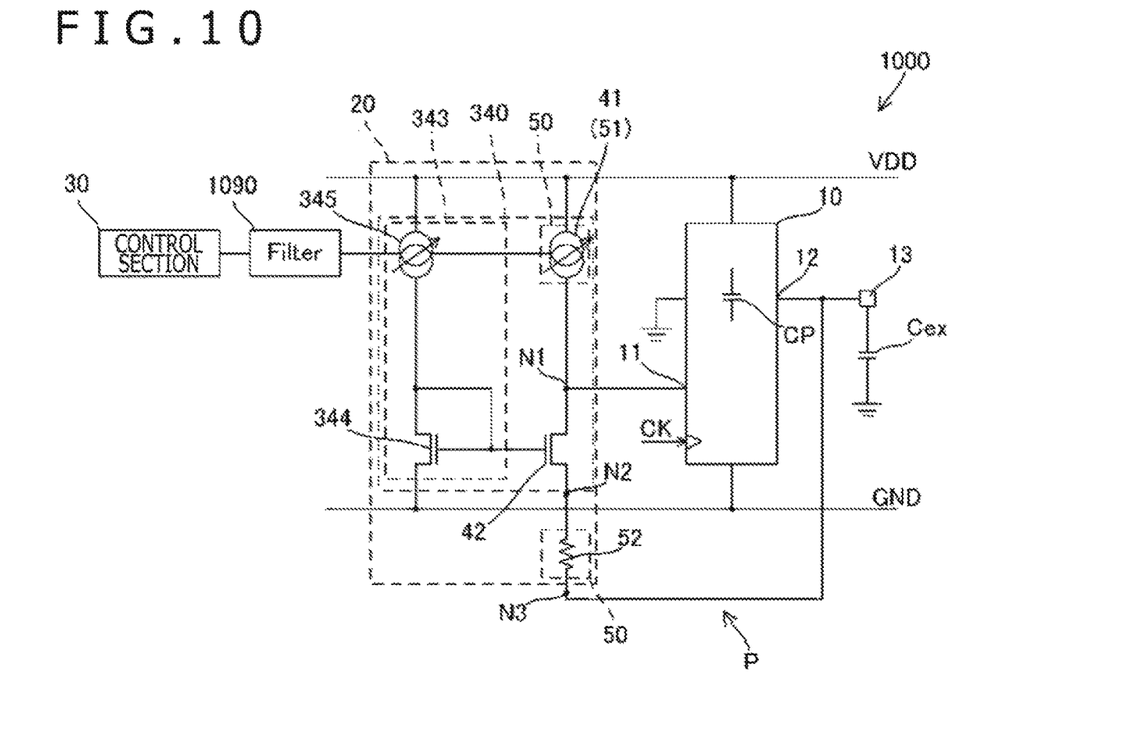
FIG. 10 is a circuit diagram depicting a schematic configuration of a power supply circuit according to a tenth embodiment.

FIG. 10 is a circuit diagram of assistance in explaining a power supply circuit according to a tenth embodiment. The power supply circuit 1000 according to the tenth embodiment adopts a configuration in which a filter 1090 is interposed on a control line along which the control section 30 controls the current values of the current source 41 (current source 51) and the current source 345.

It is to be noted that, although FIG. 10 depicts an example in which the filter 1090 is provided in the power supply circuit 300 according to the third embodiment, the similar filter may be interposed on the control line along which the current values of the current sources (41(51), 241(251), 445, 545, 547, 641(651), 645, and 647) of the other embodiments are controlled.

It is sufficient as long as the filter 1090 is a smoothing filter which removes a fluctuation of the control signal inputted to the current source, and it is sufficient if the fluctuation can be made much smaller than a bandwidth of the feedback circuit. For example, a primary RC filter can be used.

In this manner, the filter 1090 is interposed on the control line of the current source, resulting in that the fluctuation generated in a VI conversion amplifier or the like which is in the former stage of the current mirror circuit is removed, so that a noise in a current source as a major noise source can be reduced in the power supply circuit according to the present technology. Reduction of the noise in the current source can suppress the fluctuation of the voltage in the resistor 52, the fluctuation on which the fluctuation in the current source is accurately reflected via the current.

It is to be noted that the present technology is not limited to the embodiments described above and also includes a configuration in which the components disclosed in the embodiments described above are replaced with each other or a combination of the components is changed, a configuration in which the components disclosed in the related art and the embodiments described above are replaced with each other or a combination of the components is changed, and the like. Also, the technical scope of the present technology is not limited to the embodiments described above and includes the matters described in claims and equivalents thereof.

Moreover, the technical technology can have the following constitutions.

(1)

A power supply circuit including:

a charge pump circuit;

a feedback circuit feeding an output of the charge pump circuit back to an input of the charge pump circuit;

a first current source causing a constant current to flow through the feedback circuit;

a MOS transistor element interposed in a middle of the feedback circuit;

a resistor element interposed at a position closer to the output of the charge pump circuit than the MOS transistor element in the feedback circuit;

a bias circuit applying a constant voltage to a control terminal of the MOS transistor element; and a control section controlling a value of the constant current which the first current source flows through the feedback circuit.

(2)

The power supply circuit according to (1) described above, in which the constant voltage applied by the bias circuit is a voltage higher than a reference voltage by a value equivalent to a gate-source voltage of the MOS transistor element.

(3)

The power supply circuit according to (2) described above, in which a node between the MOS transistor element and the resistor element in the feedback circuit is connected to a constant voltage source via a second current source.

(4)

The power supply circuit according to any one of (1) to (3) described above, in which the constant voltage applied by the bias circuit is a voltage lower than a reference voltage by a value equivalent to a gate-source voltage of the MOS transistor element.

(5)

The power supply circuit according to any one of (1) to (4) described above, in which the feedback circuit is connected to the input of the charge pump circuit via a buffer.

(6)

The power supply circuit according to any one of (1) to (6) described above, in which an output of the buffer is inputted to the input of the charge pump circuit, a current is supplied to the buffer by a third current source, and a current value of the third current source is controlled by a voltage at a node as a terminal on a side opposite to the resistor element of the MOS transistor element in the feedback circuit.

(7)

The power supply circuit according to any one of (1) to (4) described above, further including:

an oscillator oscillation of which is controlled by a voltage at a node as a terminal on a side opposite to the resistor element of the MOS transistor element in the feedback circuit, in which an output from the oscillator is inputted to the charge pump circuit.

(8)

The power supply circuit according to any one of (1) to (4) described above, in which a control signal for controlling a current value of the first current source is inputted via a smoothing filter.

REFERENCE SIGNS LIST

10 . . . Charge pump circuit, 11 . . . Input section, 12 . . . Output section, 13 . . . Output pad, 20 . . . Feedback circuit, 30 . . . Control section, 41 . . . Current source, 42 . . . MOS transistor element, 43 . . . Bias circuit, 40 . . . Voltage adjusting circuit, 51 . . . Current source, 52 . . . Resistor, 50 . . . Potential difference forming circuit, 100 . . . Power supply circuit, 200 . . . Power supply circuit, 210 . . . Charge pump circuit, 211 . . . Input section, 212 . . . Output section, 213 . . . Output pad, 220 . . . Feedback circuit, 230 . . . Control section, 241 . . . Current source, 242 . . . MOS transistor element, 243 . . . Bias circuit, 240 . . . Voltage adjusting circuit, 251 . . . Current source, 252 . . . Resistor, 250 . . . Potential difference forming circuit, 300 . . . Power supply circuit, 343 . . . Bias circuit, 344 . . . MOS transistor element, 345 . . . Current source, 400 . . . Power supply circuit, 444 . . . MOS transistor element, 445 . . . Current source, 500 . . . Power supply circuit, 510 . . . Charge pump circuit, 511 . . . Input section, 512 . . . Output section, 513 . . . Output pad, 520 . . . Feedback circuit, 530 . . . Control section, 541 . . . Current source, 542 . . . MOS transistor element, 543 . . . Bias circuit, 544 . . . MOS transistor element, 545 . . . Current source, 546 . . . Resistor, 547 . . . Current source, 540 . . . Voltage adjusting circuit, 551 . . . Current source, 552 . . . Resistor, 550 . . . Potential difference forming circuit, 600 . . . Power supply circuit, 610 . . . Charge pump circuit, 611 . . . Input section, 612 . . . Output section, 613 . . . Output pad, 620 . . . Feedback circuit, 630 . . . Control section, 641 . . . Current source, 642 . . . MOS transistor element, 643 . . . Bias circuit, 644 . . . MOS transistor element, 645 . . . Current source, 646 . . . Resistor, 647 . . . Current source, 640 . . . Voltage adjusting circuit, 651 . . . Current source, 652 . . . Resistor, 650 . . . Potential difference forming circuit, 700 . . . Power supply circuit, 760 . . . Buffer, 800 . . . Power supply circuit, 870 . . . Current source, 900 . . . Power supply circuit, 980 . . . Oscillator, 1000 . . . Power supply circuit, 1090 . . . Filter, N1 . . . First node, N2 . . . Second node, N3 . . . Third node, P . . . Feedback path

The invention claimed is:

1. A power supply circuit, comprising:
   a charge pump circuit;
   a feedback circuit configured to feed an output of the charge pump circuit to an input of the charge pump circuit, wherein the feedback circuit includes:
      a first current source configured to generate a first current to flow through the feedback circuit;
      a metal oxide semiconductor (MOS) transistor element in a middle of the feedback circuit;
      a resistor element at a position closer to the output of the charge pump circuit than the MOS transistor element in the feedback circuit;
      a bias circuit configured to apply a constant voltage to a control terminal of the MOS transistor element;
      a second current source; and
      a second node between the MOS transistor element and the resistor element, wherein the second node is connected to a constant voltage source via the second current source; and
   a control section configured to control a value of the first current of the first current source.

2. The power supply circuit according to claim 1, wherein the constant voltage applied by the bias circuit is higher than a reference voltage by a value equivalent to a gate-source voltage of the MOS transistor element.

3. The power supply circuit according to claim 1, further comprising a buffer, wherein the feedback circuit is connected to the input of the charge pump circuit via the buffer.

4. The power supply circuit according to claim 1, further comprising:
   a third current source; and
   a buffer, wherein
      the feedback circuit further includes a first node on a first side of the MOS transistor element,
      the resistor element is on a second side of the MOS transistor element,
      the second side of the MOS transistor element is opposite to the first side of the MOS transistor element,
      an output of the buffer corresponds to the input of the charge pump circuit,
      the third current source is configured to supply a second current to the buffer, and
      a current value of the third current source is controllable by a voltage at the first node.

5. The power supply circuit according to claim 1, further comprising an oscillator configured to output a signal to the charge pump circuit, wherein
   the feedback circuit further includes a first node on a first side of the MOS transistor element,
   the resistor element is on a second side of the MOS transistor element,
   the second side of the MOS transistor element is opposite to the first side of the MOS transistor element, and
   oscillation of the oscillator is controllable by a voltage at the first node.

6. The power supply circuit according to claim 1, further comprising a smoothing filter, wherein
   the control section is further configured to control the value of the first current of the first current source based on a control signal, and
   the control signal is input by the control section to the first current source via the smoothing filter.

7. A power supply circuit, comprising:
   a charge pump circuit;
   a buffer;
   a feedback circuit configured to feed an output of the charge pump circuit to an input of the charge pump circuit, wherein
      an output of the buffer corresponds to the input of the charge pump circuit, and
      the feedback circuit includes:
         a first current source configured to generate a first current to flow through the feedback circuit;
         a metal oxide semiconductor (MOS) transistor element in a middle of the feedback circuit;
         a node on a first side of the MOS transistor element,
         a resistor element at a position closer to the output of the charge pump circuit than the MOS transistor element in the feedback circuit, wherein
            the resistor element is on a second side of the MOS transistor element, and
            the second side of the MOS transistor element is opposite to the first side of the MOS transistor element; and
         a bias circuit configured to apply a constant voltage to a control terminal of the MOS transistor element;
   a third current source configured to supply a second current to the buffer, wherein a current value of the third current source is controllable by a voltage at the node; and
   a control section configured to control a value of the first current of the first current source.

\* \* \* \* \*